United States Patent
Shin et al.

(10) Patent No.: US 7,061,783 B2
(45) Date of Patent: Jun. 13, 2006

(54) CONTENT ADDRESSABLE MEMORY (CAM) CAPABLE OF FINDING ERRORS IN A CAM CELL ARRAY AND A METHOD THEREOF

(75) Inventors: Ho-Geun Shin, Suwon-si (KR); Young-Hyun Jun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/973,806

(22) Filed: Oct. 26, 2004

(65) Prior Publication Data

US 2005/0105315 A1 May 19, 2005

(30) Foreign Application Priority Data

Nov. 3, 2003 (KR) .................. 10-2003-0077392

(51) Int. Cl.
*G11C 15/00* (2006.01)
*G11C 8/00* (2006.01)

(52) U.S. Cl. ........................ 365/49; 365/240
(58) Field of Classification Search ............. 365/49, 365/240

See application file for complete search history.

(56) References Cited

U.S. PATENT DOCUMENTS

| | | | |
|---|---|---|---|
| 6,430,072 B1 * | 8/2002 | Chadwick et al. | 365/49 |
| 6,539,455 B1 * | 3/2003 | Khanna et al. | 711/108 |
| 6,744,688 B1 * | 6/2004 | Gillingham et al. | 365/227 |
| 6,807,077 B1 * | 10/2004 | Noda et al. | 365/49 |
| 2003/0184238 A1 * | 10/2003 | Osame et al. | 315/169.3 |
| 2004/0047209 A1 * | 3/2004 | Lien et al. | 365/202 |

FOREIGN PATENT DOCUMENTS

JP   5-128900   5/1993

* cited by examiner

*Primary Examiner*—Amir Zarabian
*Assistant Examiner*—Anthan Tran
(74) *Attorney, Agent, or Firm*—F. Chau & Associates, LLC

(57) ABSTRACT

A method of finding errors in a content addressable memory (CAM) and a CAM cell array, the CAM being capable of finding errors in the CAM cell array, is disclosed. The CAM includes the CAM cell array having a plurality of CAM cells and a match line state storing unit. The match line state storing unit is connected to a word line and a match line of the plurality of CAM cells and has a plurality of state cells in which a logic level of stored data is changed according to a logic level of the match line. Errors in the CAM cell array are found by reading data stored in the plurality of state cells. The data stored in the plurality of state cells are matched when there are no errors in the CAM cell array.

8 Claims, 10 Drawing Sheets

CONTENT ADDRESSABLE MEMORY (CAM) CAPABLE OF FINDING ERRORS IN A CAM CELL ARRAY AND A METHOD THEREOF

CROSS-REFERENCE TO RELATED APPLICATION

This application claims priority to Korean Patent Application No. 2003-77392, filed on Nov. 3, 2003, in the Korean Intellectual Property Office, the disclosure of which is incorporated herein in its entirety by reference.

TECHNICAL FIELD

The present invention relates to a content addressable memory (CAM), and more particularly, to a CAM capable of finding errors in a CAM cell array and a method of finding errors in the CAM cell array.

DISCUSSION OF THE RELATED ART

A random access memory (RAM) or a read only memory (ROM) uses an address to indicate a specific address of a memory cell inside a memory cell array and outputs data stored in the memory cell corresponding to the address. However, a content addressable memory (CAM) receives external data, compares the external data and data stored therein to determine if they are matched or not, and outputs an address corresponding to the compared result.

Each cell of the CAM includes comparing logic. Data input to the CAM is compared to data stored in all of its cells and an output address indicates a matched result. The CAM is frequently used in fields which require fast retrieval of information such as a pattern, a list, and image data.

The CAM is divided into two types, a binary CAM and a ternary CAM (TCAM). A typical binary CAM includes a RAM cell for storing one of two logic states "1" and "0". The binary CAM compares external data (e.g., search data) to data stored in its RAM cell and has a comparing circuit for setting a corresponding match line to a constant logic state if the search data and the stored data are matched.

Examples of binary CAMs are disclosed in U.S. Pat. Nos. 4,646,271, 4,780,845, 5,490,102, and 5,495,382. The TCAM can store three logic states, that is, "1", "0", and "don't care". An example of a TCAM is disclosed in U.S. Pat. No. 5,319,590.

FIG. 1 shows the structure of a conventional CAM 100. As shown in FIG. 1, data is stored in a CAM cell array 110 and search data is transmitted from a search data/mask register 130 to the CAM cell array 110. Thereafter, the data stored in the CAM cell array 110 and the search data are compared. If the stored data and the search data are matched, a logic level of a match line (not shown) is set to a either a high level or a low level. Then a match line detector 150 detects the logic level of the match line. A priority encoder 160 receives an output signal from the match line detector 150 and outputs an address of a word line connected to a CAM cell in which the stored data and the search data are matched.

In general, the CAM 100 uses the priority encoder 160 to find errors in the CAM cell array 110. However, because the priority encoder 160 is designed to output a word line address of a least significant bit (LSB), when there are multiple word line addresses having a match between the stored data and the search data, a long amount of time is required to find errors in the CAM cell array 110.

FIG. 2 shows a method of finding errors in the CAM cell array 110 using the priority encoder 160. For example, it is assumed that one block of the CAM cell array 110 is made up of m×n cells ("m" denotes a number of rows and "n" denotes a number of columns). Because the priority encoder 160 outputs only a word line address of the LSB when there are multiple word line addresses having a match between the stored data and the search data, the other matching addresses are unknown.

Hereinafter, a state in which the other matching addresses are unknown is expressed as "mask". In order to verify the CAM cell array 110 without any word line addresses being masked by the priority encoder 160, the same data, for example, "00" is written in the first word line through the (m−1)-th word line and "01" is written in the m-th word line. Thereafter, by using "01" as the search data, whether the address of the m-th word line is output from the priority encoder 160 is verified (as shown in FIG. 2(1)). Next, after "00" is written in the first word line through the (m−2)-th word line and "01" is written in the (m−1)-th word line and the m-th word line, whether the address of the (m−1)-th word line is output from the priority encoder is verified (as shown in FIG. 2(2)).

If there are no errors in CAM cells connected to the (m−1)-th word line of the CAM cell array 110, the priority encoder 160 outputs the LSB address of two word line addresses (the m-th word line and the (m−1-th word line) in which the stored data and the search data are matched, that is, the (m−1)th word line address.

With reference to blocks (1) through (4) of FIG. 2, a black colored portion in each block illustrates a word line for outputting a word line address in which the stored data and the search data are matched and a upper portion of the word line for outputting the word line address is a masked portion. When there are no errors in the CAM cell array 110 its m×n cells are verified by proceeding until the first word line is verified. In order to verify all the m×n CAM cells, data is written m(m+1)/2 times in the CAM cell array 110 and a search operation is performed m(m+1)/2 times. Thus, as CAM densities increase, the time and expenses associated with finding errors therein also increase.

SUMMARY OF THE INVENTION

The present invention provides a content addressable memory (CAM) capable of reducing time to find errors in a CAM cell array and a method thereof.

According to an aspect of the present invention, there is provided a CAM including: a CAM cell array having a plurality of CAM cells; and a match line state storing unit which is connected to a word line and a match line of the plurality of CAM cells and has a plurality of state cells in which a logic level of stored data is changed according to a logic level of the match line, where errors of the CAM cell array are found by reading the data stored in the state cells. The plurality of CAM cells share the word line and match line that are connected to the match line state storing unit.

The data stored in the state cells are matched when there are no errors in the CAM cell array. A first state cell includes a state memory cell, a first state transistor, and a second state transistor. The state memory cell is connected to the word line and stores data of a third bit line pair. A first port of the first state transistor is connected to the state memory cell and a gate of the first state transistor is connected to a corresponding match line of the CAM cell. A first port of the second state transistor is connected to a second port of the first state transistor, a gate of the second state transistor is connected to an enable signal, and a second port of the second state transistor is connected to a first voltage. The first and second transistors may be negative channel metal oxide semiconductor (NMOS) transistors.

The CAM cell comprises: a first memory cell which is connected to the word line and stores data of a first bit line pair; a second memory cell which is connected to the word line and stores data of a second bit line pair; and a comparing circuit which compares search data input through a search line pair to the data stored in the first and second memory cells and determines a logic level of the match line according to the comparison result.

The first memory cell comprises a first latch and the second memory cell comprises a second latch, the first latch comprises: a first and second inverter, and first and second access transistors whose gates are connected to the word line and which transmit data of the first bit line pair to the first latch, the second latch comprises: a third and fourth inverter, and third and fourth access transistors whose gates are connected to the word line and which transmit data of the second bit line pair to the second latch.

The comparing circuit comprises: a first comparing transistor whose first port is connected to the match line and whose gate receives data stored in the first memory cell; a second comparing transistor whose first port is connected to a second port of the first comparing transistor, whose gate is connected to a first search line of the search line pair, and whose second port is connected to a second voltage; a third comparing transistor whose first port is connected to the match line and whose gate receives data stored in the second memory cell; and a fourth comparing transistor whose first port is connected to a second port of the third comparing transistor, whose gate is connected to a second search line of the search line pair, and whose second port is connected to the second voltage. According to another aspect of the present invention, there is provided a method of finding errors in a CAM cell array, in a CAM including the CAM cell array having a plurality of CAM cells and a state cell corresponding to the plurality of CAM cells sharing a same word line and match line, including: writing data in the state cell; writing data in the plurality of CAM cells; performing a search operation for the plurality of CAM cells; and finding errors in the CAM cell array by reading the data stored in the state cell.

The search operation includes conducting search data, which is the same as the data written in the plurality of CAM cells, to the plurality of CAM cells and determining a logic level of the match line by comparing the data stored in the plurality of CAM cells to the search data. When finding errors in the CAM cell array, data read from the state cell are the same, when there are no errors in the CAM cell array.

The method of finding errors in the CAM cell array further includes: conducting search data, which is opposite the data written in the plurality of CAM cells, to the CAM cells; determining a logic level of the match line by comparing the data stored in the plurality of CAM cells to the search data; and finding errors in the CAM cell array by reading the data stored in the state cell.

According to another aspect of the present invention, there is provided a CAM including: a CAM cell array having first through nth CAM cells; a search data generating unit which receives an n-bit search data pattern and conducts first through nth search data to the first through nth CAM cells sharing a same word line and match line in response to first through nth control signals; and a shift register unit which generates the first through nth control signals whose logic levels are sequentially inverted in response to a clock signal wherein n is an integer. Logic levels of the first through nth search data are inverted when the corresponding first through nth control signals are generated with a first logic level.

The shift register unit includes first through nth shift registers and an initial shift register. The first through nth shift registers are reset to a second logic level in response to a reset signal and sequentially generate the first through nth control signals with the first logic level in response to the clock signal. The initial shift register is reset to the first logic level in response to the reset signal and conducts an output signal to the first shift register in response to the clock signal.

The search data generating unit includes first through nth control units which receive a corresponding bit of the n-bit search data pattern and output the search data in response to a corresponding control signal. Each of the first through nth control units includes a latch unit, a first inverter, and a selecting unit. The latch unit receives the corresponding bit of the search data pattern and latches the bit. The first inverter inverts an output signal of the latch unit. The selecting unit outputs one of an output signal of the first inverter and an output signal of the latch unit as the search data in response to the corresponding control signal. The selecting unit outputs the output signal of the latch unit as the search data when the corresponding control signal is at the first logic level.

According to another aspect of the present invention, there is provided a method of finding errors in a CAM cell array, including: generating first through nth control signals whose logic levels are sequentially inverted in response to a clock signal; receiving an n-bit search data pattern; in response to the first through nth control signals, outputting the n-bit search data pattern as the first through nth search data and a value, which is opposite a logic level of the search data pattern, as the first through nth search data; and finding errors in CAM cells of the CAM by conducting the first through nth search data to corresponding CAM cells wherein n is an integer.

When outputting the first through nth search data, a value, which is opposite the logic level of the search data pattern, is output as the first through nth search data when the first through nth control signals are at a first logic level. The n-bit search data pattern is output as the first through nth search data when the first through nth control signals are at a second logic level.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS

Figure 1:
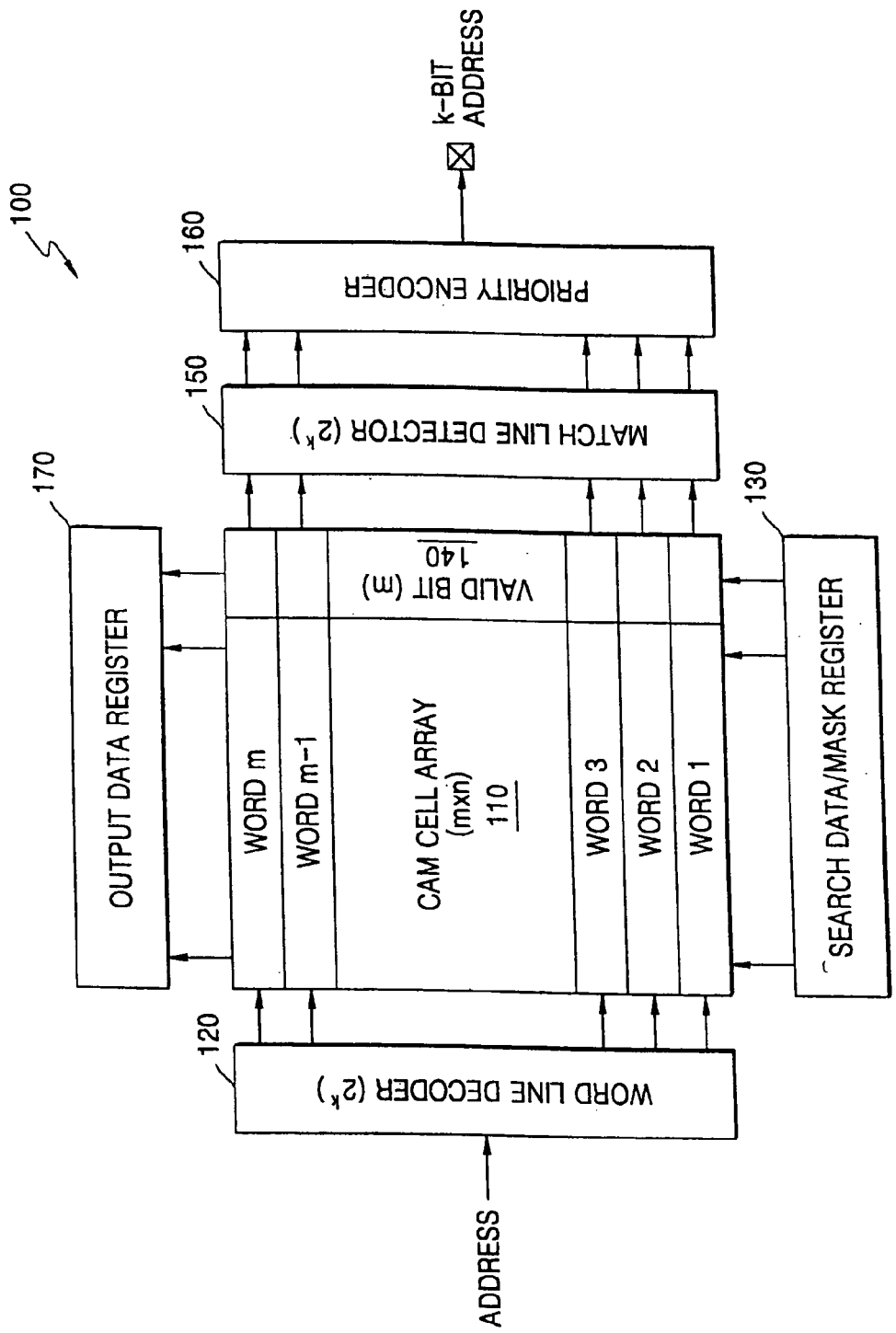
FIG. 1 shows a typical content addressable memory (CAM) structure.
Figure 2:
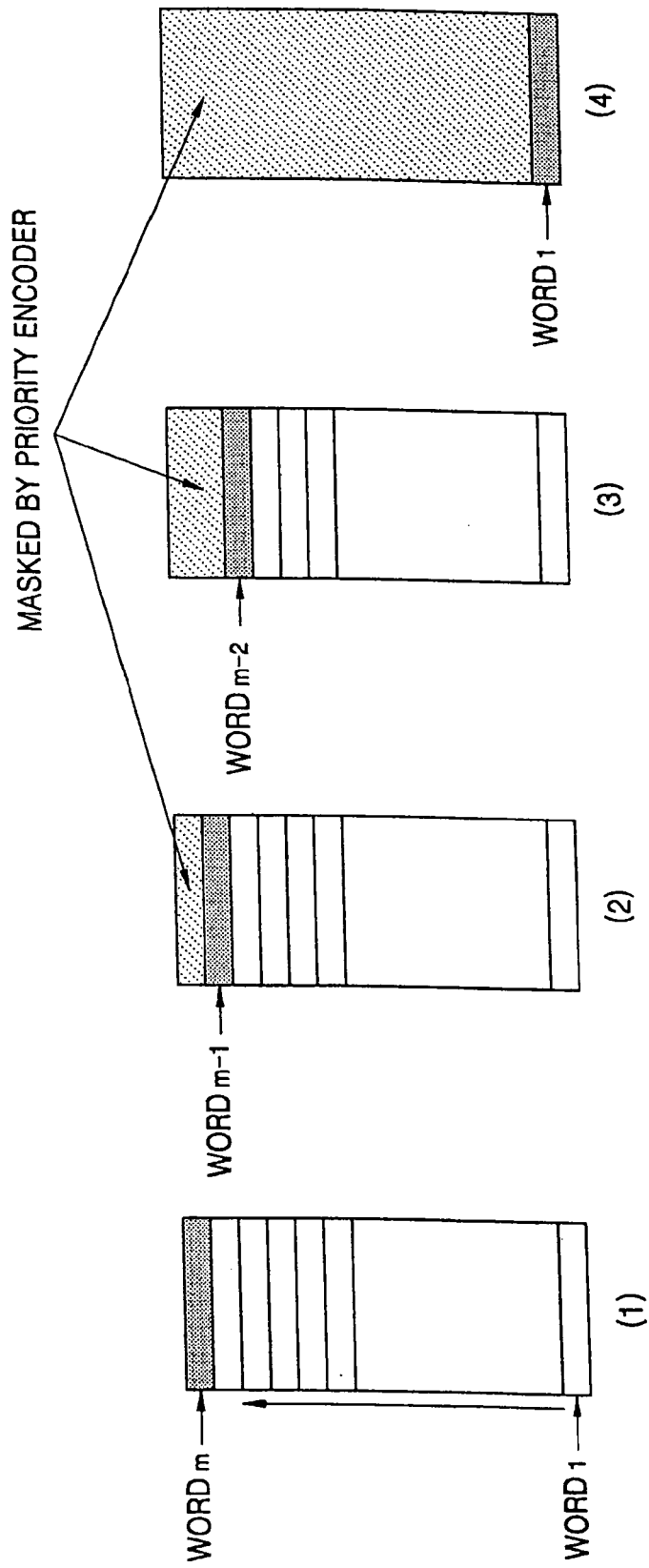
FIG. 2 shows a method of finding errors in a CAM cell array using a priority encoder.
Figure 3:
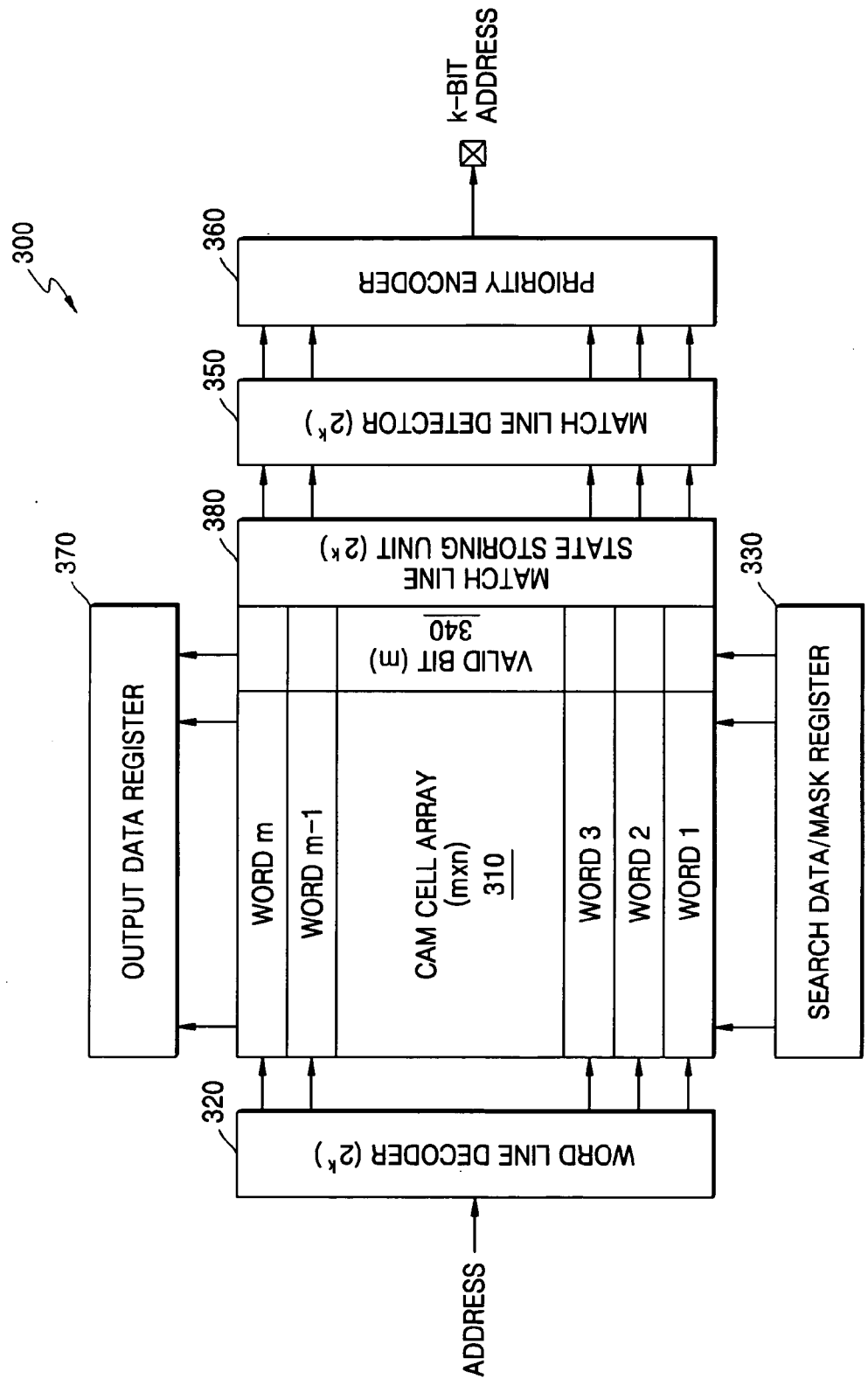
FIG. 3 shows a CAM structure according to an exemplary embodiment of the present invention.

FIG. 3 shows a content addressable memory (CAM) structure 300 according to an exemplary embodiment of the present invention. With reference to FIG. 3, a match line state storing unit 380 is located between a CAM cell array 310 and a match line detector 350 in order to find errors in the CAM cell array 310. The match line state storing unit 380 stores a logic level state of a match line (not shown). That is, in a case where there are errors in CAM cells connected to word lines of the CAM cell array 310, a logic level of a match line connected thereto is changed to a low level (in a case where the match line is precharged to a high level) and in a case where there are no errors in the CAM cells connected to the word lines of the CAM cell array 310, the logic level of the match line connected thereto remains at the high level. Therefore, the match line state storing unit 380 can find errors in the CAM cell array 310 by storing the logic level state of the match line.

Figure 4:
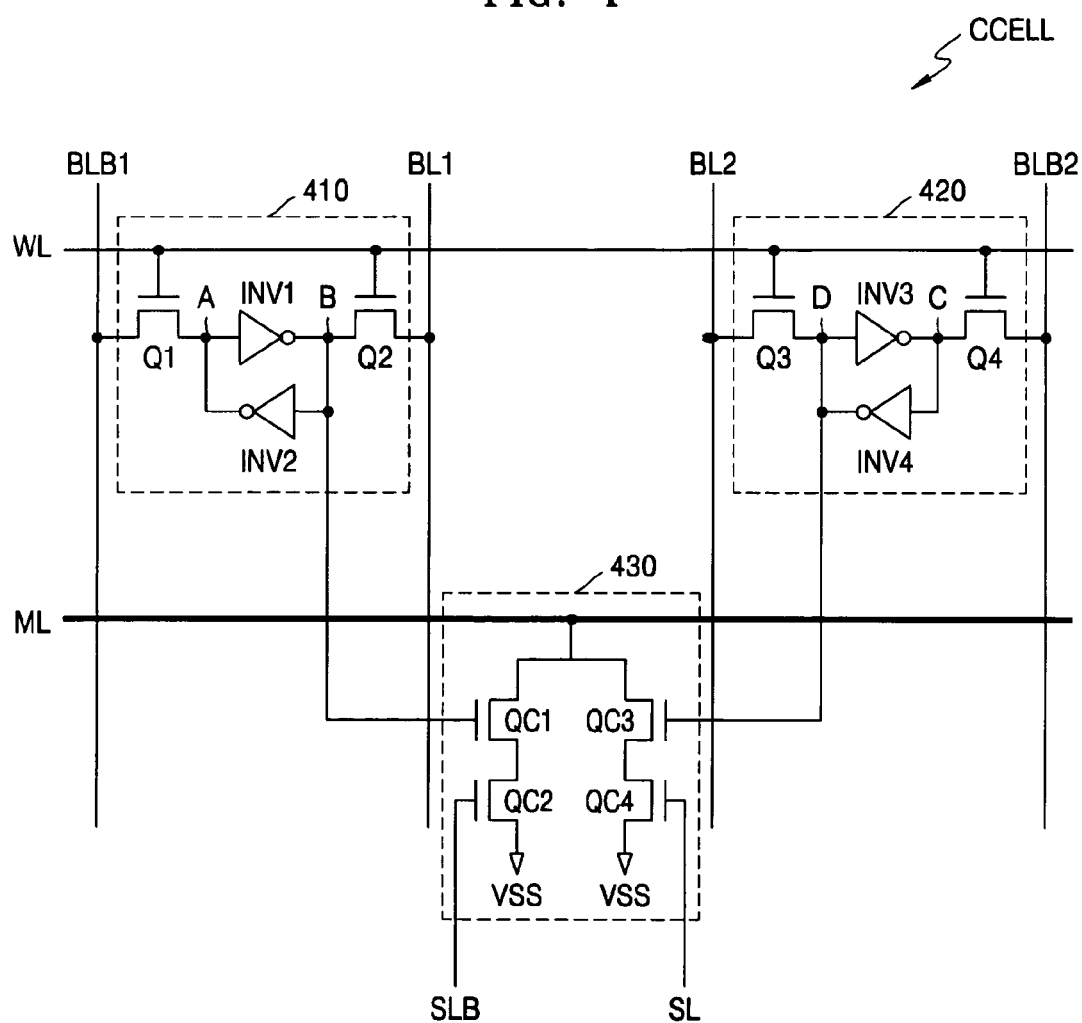
FIG. 4 is a circuit diagram describing a CAM cell structure of a CAM cell array.

FIG. 4 is a circuit diagram describing a CAM cell structure of, for example, the CAM cell array 310. With reference to FIG. 4, a CAM cell (CCELL) includes first and second memory cells 410, 420 to store data and a comparing circuit 430. The first and second memory cells 410, 420 are static random access memory (SRAM) cells.

The first memory cell 410 includes a latch having two inverters INV1, INV2, first and second access transistors Q1, Q2, whose gates are connected to a word line WL and which transmit data of a bit line pair BL1, BLB1 to the latch. Likewise, the second memory cell 420 includes a latch having two inverters INV3, INV4, third and fourth access transistors Q3, Q4, whose gates are connected to the word line WL and which transmit data of a bit line pair BL2, BLB2 to the latch.

The comparing circuit 430 includes first through fourth comparing transistors OC1, QC2, QC3, QC4. The first and second comparing transistors QC1, QC2 are connected in series, a drain of the first comparing transistor QC1 is connected to a match line ML, and a source of the second comparing transistor QC2 is connected to a ground voltage VSS. A gate of the first comparing transistor QC1 is connected to a node B of the first memory cell 410 and a gate of the second comparing transistor QC2 is connected to a complementary search line SLB. Likewise, the third and fourth comparing transistors QC3, QC4 are connected in series, a drain of the third comparing transistor QC3 is connected to the match line ML, and a source of the fourth comparing transistor QC4 is connected to the ground voltage VSS. A gate of the third comparing transistor QC3 is connected to a node D of the second memory cell 420 and a gate of the fourth comparing transistor QC4 is connected to a search line SL.

A write operation of data in the CAM cell CCELL is now described. Data to be stored in the first and second memory cells 410, 420 are conducted to the bit line pairs BL1, BLB1, BL2, BLB2. When the word line WL is active, at the high level, the first through fourth access transistors Q1, Q2, Q3, Q4 are turned on. Thereafter, data conducted to the bit line pairs BL1, BLB1, BL2, BLB2 are stored in the first and second memory cells 410, 420 and the word line WL is inactive.

A read operation in the CAM cell CCELL is now described. The word line WL is active at the high level and the data stored in the first and second memory cells 410, 420 are conducted to the bit line pairs BL1, BLB1, BL2, BLB2. The data of the bit line pairs BL1, BLB1, BL2, BLB2 are also conducted to a data bus (not shown).

A search and comparing operation of the CAM cell CCELL is now described. The match line is first precharged to the high level and the search data is conducted to the search line pair SL, SLB. For the convenience of description, the match line is first precharged to the high level in the present invention. However, the match line does not have to be precharged to the high level and may be precharged to the low level.

If the search data and the stored data are not matched, a logic level of the match line ML is changed to the low level. However, if the search data and the stored data are matched, the logic level of the match line ML remains at the high level. For example, assume that a logic "1" is stored in the first memory cell 410, a logic "0" is stored in the second memory cell 420, the search line SL is conducted to the logic "1", and the complementary search line SLB is conducted to the logic "0".

The first memory cell 410 then conducts the logic "1" to the first comparing transistor QC1 and the first comparing transistor QC1 is turned on. The complementary search line SLB conducts the logic "0" to the second comparing transistor QC2 and the second comparing transistor QC2 is turned off. Because the first comparing transistor QC1 is turned on and the second comparing transistor QC2 is turned off, the logic level of the match line ML remains at the high level.

The second memory cell 420 then conducts the logic "0" to the third comparing transistor QC3 and the third comparing transistor QC3 is turned off. The search line SL conducts the logic "1" to the fourth comparing transistor QC4 and the fourth comparing transistor QC4 is turned on. Because the third comparing transistor QC3 is turned off and the fourth comparing transistor QC4 is turned on, the logic level of the match line ML remains at the high level. In the above example the search data and the stored data are matched.

Figure 5:
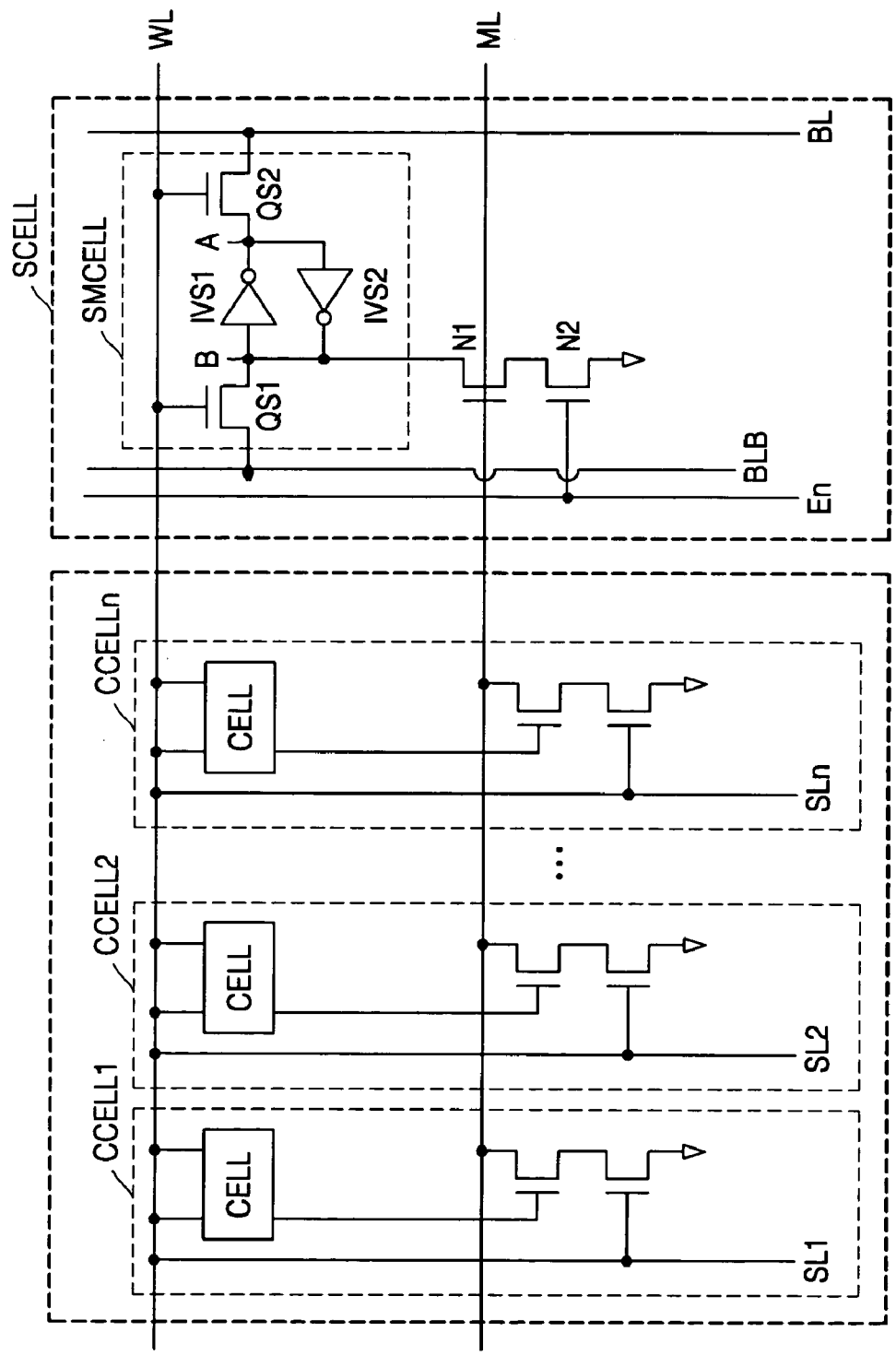
FIG. 5 is a circuit diagram describing a state cell structure of a match line state storing unit of FIG. 3.

FIG. 5 is a circuit diagram describing a state cell structure of the match line state storing unit 380 of FIG. 3. The match line state storing unit 380 is connected to both a word line WL and a match line ML of CAM cells CCELL1, CCELL2 . . . CCELLn sharing the same word line WL and match line ML and includes a plurality of state cells where a logic level of the stored data is changed according to a logic level of the match line ML. Data stored in the state cells are the same if there are no errors in the CAM cell array 310.

With reference to FIG. 5, a state cell SCELL includes a state memory cell SMCELL, a first state transistor N1, and a second state transistor N2. The state memory cell SMCELL is connected to the word line WL and stores data of a bit line pair BL, BLB. A first port of the first state transistor N1 is connected to the state memory cell SMCELL at a node B and an output of an inverter IVS2 and a gate of the first state transistor N1 is connected to the match line ML of a corresponding CAM cell. A first port of the second state transistor N2 is connected to a second port of the first state transistor N1, a gate of the second state transistor N2 is connected to an enable signal EN, and a second port of the second state transistor N2 is connected to a first voltage VSS which is a ground voltage. The first and second state transistors N1, N2 may be negative channel metal oxide semiconductor (NMOS) transistors.

The node B is located between a second port of a first transistor QS1 and an input of an inverter IVS1. A first port of the first transistor QS1 is connected to the bit line BLB, and a gate of the first transistor QS1 is connected to the world line WL. A node A is located between an output of the inverter IVS1, an input of the inverter IVS2, and a first port of a second transistor QS2. A gate of the second transistor QS2 is connected to the word line WL and a second port of the second transistor QS2 is connected to the bit line BL.

Figure 6:
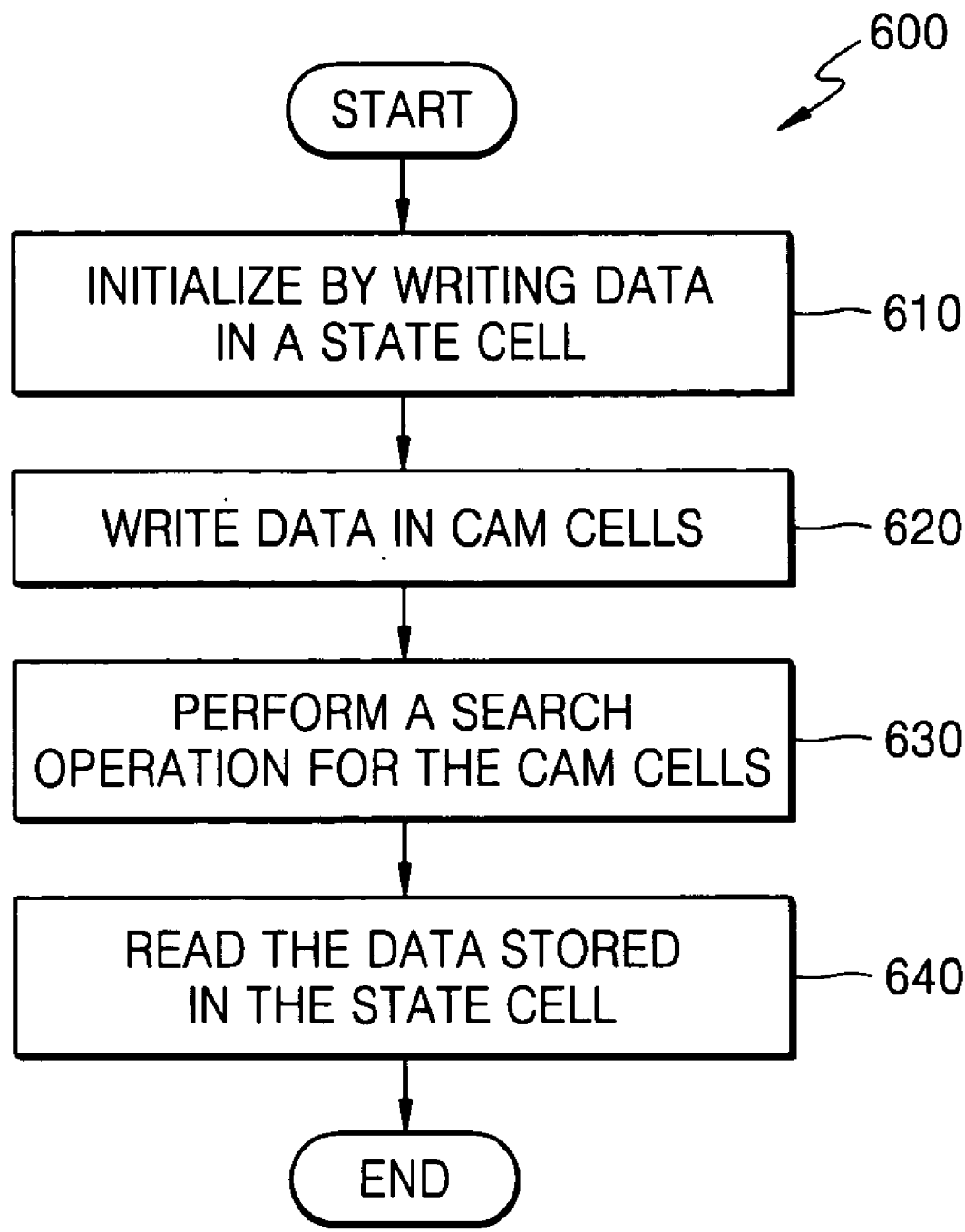
FIG. 6 is a flow chart describing a method of finding errors in a CAM cell array according to another exemplary embodiment of the present invention.

FIG. 6 is a flow chart describing a method of finding errors in a CAM cell array according to another exemplary embodiment of the present invention. With reference to FIG. 6, a method 600 of finding errors in a CAM cell array, in a CAM including, for example, the CAM cell array 310 having a plurality of CAM cells and a state cell, for example, the SCELL of FIG. 5 corresponding to the CAM cells sharing the same word line and match line, includes initializing in step 610 by writing data in the state cell SCELL, writing data in the CAM cells in step 620, performing a search operation for the CAM cells in step 630, and finding errors in the CAM cell array in step 640 by reading the data stored in the state cell SCELL.

With reference to FIGS. 5 and 6, the method of finding errors in the CAM cell array according to an exemplary embodiment of the present invention is now described in detail. First, initialization is performed in step 610 by writing data in the state cell SCELL. During initialization of the state cell SCELL, low level data is stored in the node A of the state cell SCELL when data is written in the CAM cells of the CAM cell array 310. That is, high level data is stored in the node B of the state cell SCELL. However, logic levels of the data stored in the nodes A and B may be inverted.

Data is written in step 620 to the CAM cells. Next, a search operation is performed in step 630 for the CAM cells. The search operation includes conducting the search data, which is the same as the data that has been written in the CAM cells, to the CAM cells and determining the logic level of the match line ML by comparing the data stored in the CAM cells to the search data.

Data is then written from the CAM cells connected to the first word line (not shown) to the CAM cells connected to an mth word line (not shown). Thereafter, the search operation is performed by conducting search data matching the written data to the CAM cell.

In a case where the match line ML is precharged to the high level, because the written data and the search data are matched, the match line ML remains at the high level. When the enable signal EN is active at the high level, the first and second state transistors N1, N2 are turned on. The enable signal EN enables the match line state storing unit 380 to become active only when errors are found in the CAM cell array 310. If the first and second state transistors N1, N2 are turned on, the node A of the state memory cell SMCELL is changed to the high level. If there are no errors in the CAM cells of the CAM cell array 310, the state cells of the match line state storing unit 380 store the high level data in their state memory cell SMCELL.

Finally, errors in the CAM cell array are found in step 640 by reading the data stored in the state cells. The data stored in the state cells are read and if the read value is at the high level, it is verified that the CAM cell array 310 is normal.

When the search data opposite the data written in the CAM cells of the CAM cell array 310 is conducted to the CAM cells and the search data is compared to the data written in the CAM cells, because the search data and the written data are not matched, the logic level of the match line is changed to the low level. Thereafter, the first state transistor N1 is turned off and the node A of the state memory cell SMCELL remains at the low level. If there are no errors in the CAM cells of the CAM cell array 310, the state cells of the match line state storing unit 380 store the low level data in their state memory cells SMCELL and output the low level data.

That is, if the data output from the state cells of the match line state storing unit 380 are at the low level, there are no errors in the CAM cells of the CAM cell array 310. Likewise, if the error finding is performed by changing the written data and the search data, a time as long as (2m+1)× (the number of patterns of the search data) for m writing operations of the CAM cells during one search operation, and m read operations of the state cells takes place, and the error finding time may be reduced.

Figure 7:
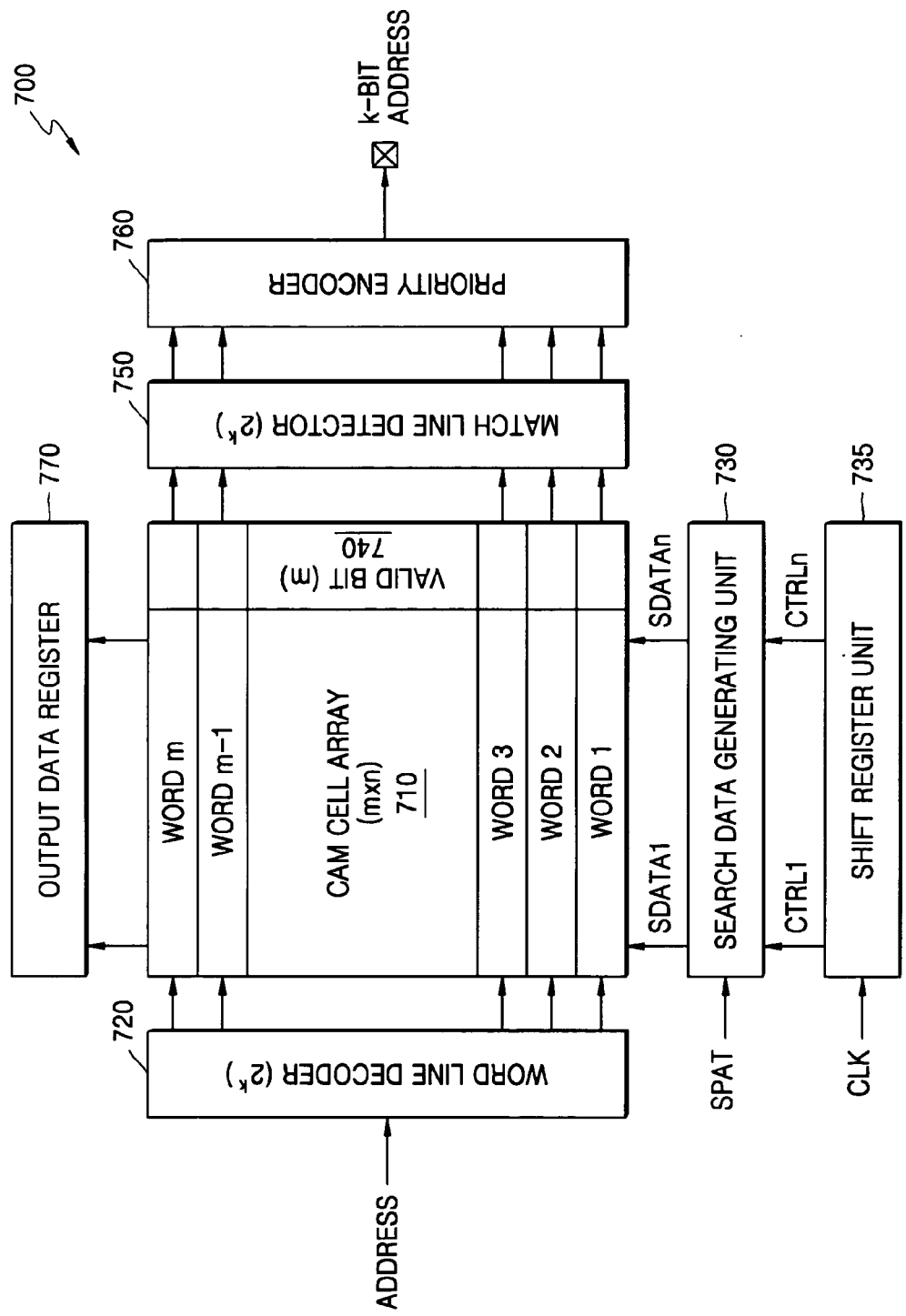
FIG. 7 shows a CAM structure according to yet another exemplary embodiment of the present invention.

FIG. 7 shows a CAM structure according to yet another exemplary embodiment of the present invention. If there is an error in one of the CAM cells sharing a word line, a logic level of a match line connected to the CAM cells sharing the word line is changed. Therefore, a CAM cell that has an error of the CAM cells sharing the word line is unknown and error finding must be performed for each of the CAM cells sharing the word line. The CAM structure of FIG. 7 can be used to find errors in each of the CAM cells sharing the word line.

With reference to FIG. 7, a CAM 700 includes a CAM cell array 710 having a plurality of CAM cells, a search data generating unit 730, and a shift register unit 735.

The search data generating unit 730 receives an n-bit search data pattern SPAT and conducts first through nth search data SDATA1~SDATn to the first through nth CAM cells (not shown) sharing the same word line and match line in response to first through nth control signals CTRL1~CTRLn.

The shift register unit 735 generates the first through nth control signals CTRL1~CTRLn whose logic levels are sequentially inverted in response to a clock signal CLK. The logic levels of the first through nth search data SDATA1~SDATn are inverted when the first through nth control signals CTRL1~CTRLn are generated at the first level.

Figure 11:
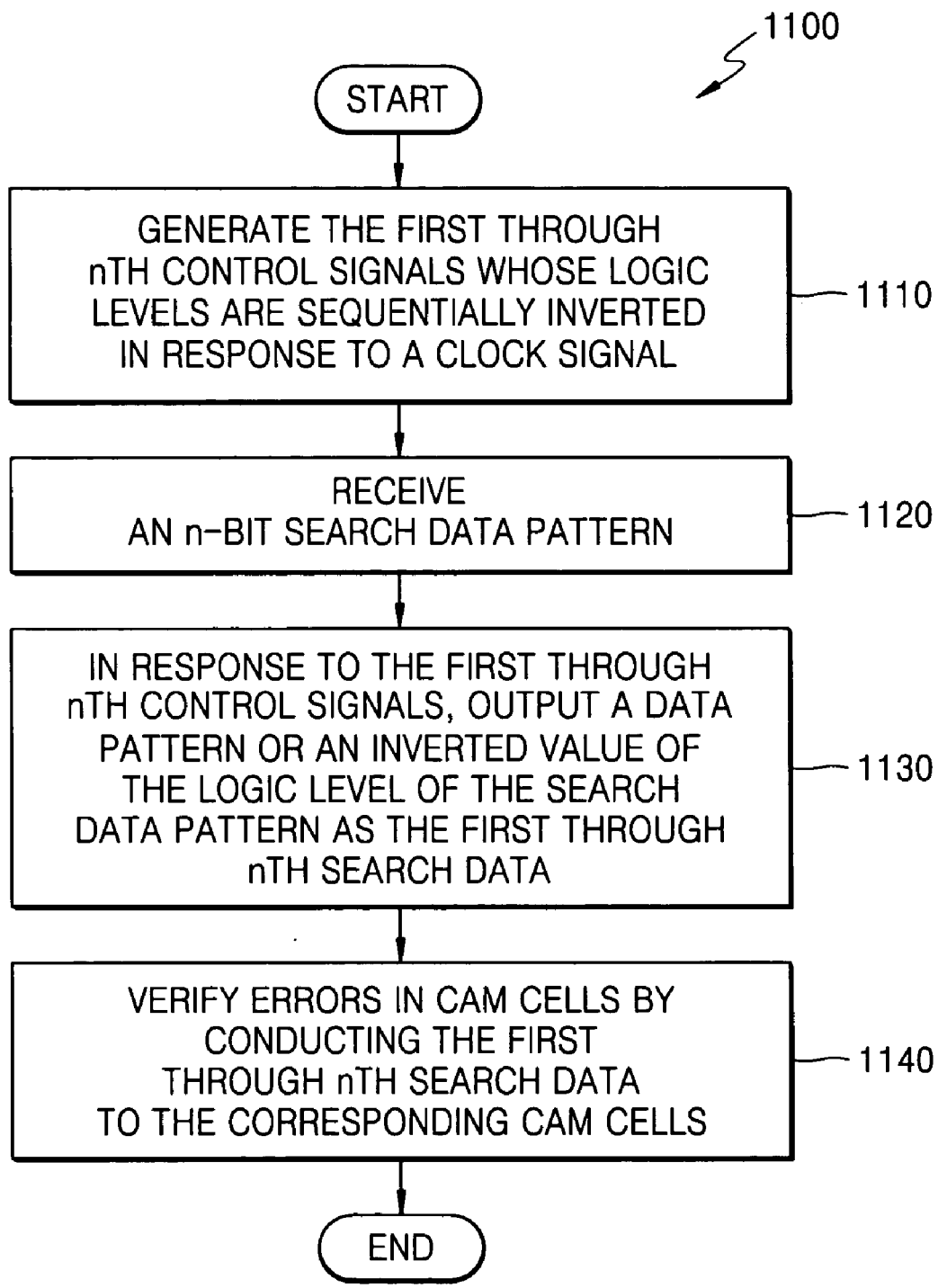
FIG. 11 is a flow chart describing a method of finding errors in a CAM cell array according to another exemplary embodiment of the present invention.

FIG. 11 is a flow chart describing a method 1100 of finding errors in a CAM cell array according to another exemplary embodiment of the present invention. The method of FIG. 11 corresponds to the operation of the CAM 700 of FIG. 7. With reference to FIG. 11, the method 1100 of finding errors in the CAM cell array includes generating the first through nth control signals CTRL1~CTRLn whose logic levels are sequentially inverted in response to a clock signal CLK in step 1110, receiving an n-bit search data pattern SPAT in step 1120, in response to the first through nth control signals CTRL1~CTRLn, outputting the search data pattern SPAT as the first through nth search data SDATA1~SDATAn or outputting a value opposite a logic level of the search data pattern SPAT as the first through nth search data SDATA1~SDATn in step 1130, and finding errors in CAM cells in step 1140 by conducting the first through nth search data SDATA1~SDATAn to corresponding CAM cells.

Figure 8:
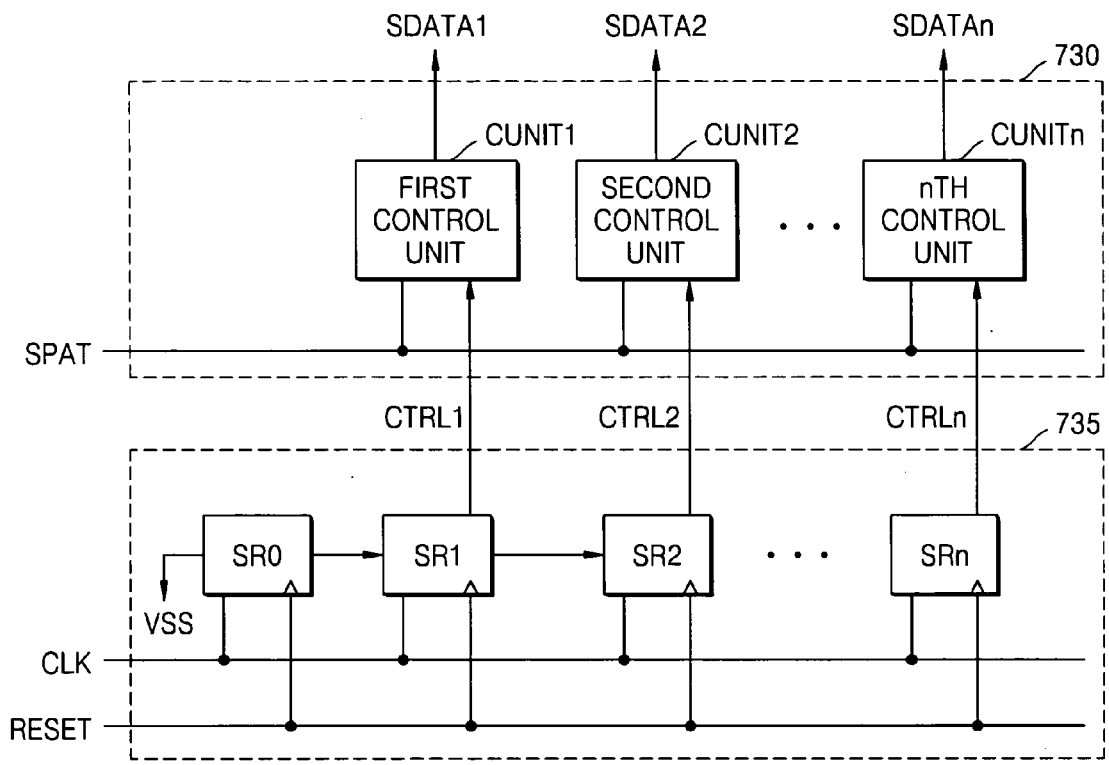
FIG. 8 shows a structure of a shift register unit and a search data generating unit of FIG. 7.
Figure 9:
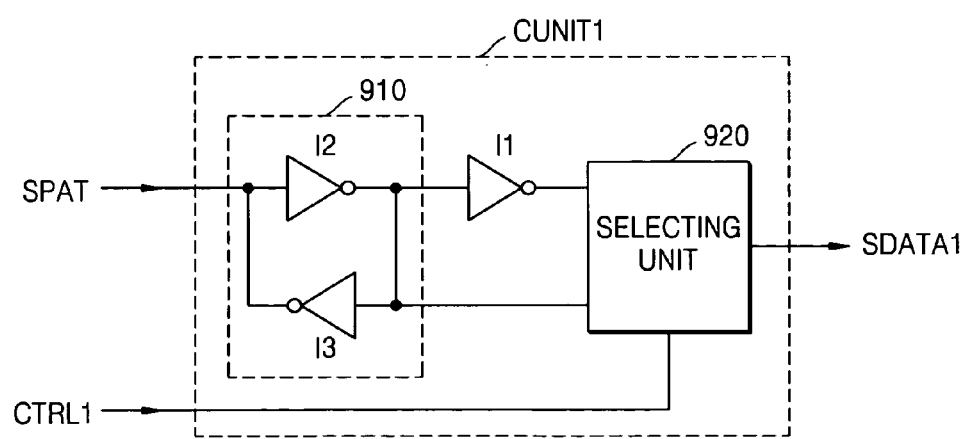
FIG. 9 shows a first control unit structure of FIG. 8.

With reference to FIGS. 7 and 11, a method of finding errors in each bit of the CAM cell and a CAM operation capable of finding the errors is described using FIGS. 8, 9, 10a, and 10b. FIG. 8 shows a structure of the shift register unit 735 and the search data generating unit 730 of FIG. 7. FIG. 9 shows a first control unit CUNIT1 structure of FIG. 8.

The first through nth control signals CTRL1~CTRLn whose logic levels are sequentially inverted in response to the clock signal CLK are generated in step 1110. The generation of the first through nth control signals CTRL1~CTRLn corresponds to the operation of the shift register unit 735 of FIG. 7.

The shift register unit 735 includes first through nth shift registers SR1~SRn and an initial shift register SR0. The first through nth shift registers SR1~SRn are reset to the second level in response to a reset signal RESET. Thereafter, each of the first through nth shift registers SR1~SRn sequentially generates the first through nth control signals CTRL1~CTRLn with the first level.

An initial shift register SR0 is reset to the first level in response to the reset signal RESET and shifts an output value to the first shift register SR1 in response to the clock signal CLK. For convenience of description, it is assumed that the first level is the high level and the second level is the low level.

The initial shift register SR0 stores the high level value in response to the reset signal RESET and the first through nth shift registers SR1~SRn store the low level value in response to the clock signal CLK. Next, the initial shift register SR0 shifts the stored high level value to the first shift register SR1 in response to the clock signal CLK. Thereafter, the initial shift register SR0 stores the low level value using a ground voltage VSS.

That is, in response to the clock signal CLK, the high level value shifts from the initial shift register SR0 to the first shift register SR1. Next, in response to next clock of the clock signal CLK, the high level value of the first shift register SR1 shifts to the second shift register SR2 and the first shift register SR1 stores the low level value. Likewise, each of the first through nth shift registers SR1~SRn sequentially stores the high level value. Therefore, the first through nth shift registers SR1~SRn sequentially generate the first through nth control signals CTRL1~CTRLn with the high level, respectively.

The search data generating unit 730 receives the n-bit search data pattern in step 1120. Next, in response to the first through nth control signals CTRL1~CTRLn, the search data pattern or the value opposite the logic level of the search data pattern is output in step 1130 as the first through nth search data.

The search data generating unit 730 receives one corresponding bit of the search data pattern SPAT and includes first through nth control units CUNIT1~CUNITn which output first through nth search data SDATA1~SDATn in response to the first through nth control signals CTRL1~CTRLn. The first through nth control units CUNIT1~CUNITn output an inverted search data pattern as the first through nth search data SDATA1~SDATAn if the logic level of the received control signals CTRL1~CTRLn are at the high level. Also, the first through nth control units CUNIT1~CUNITn output the search data pattern SPAT as the first through nth search data SDATA1~SDATAn if the logic level of the received control signals CTRL1~CTRLn are at the low level.

Each of the first through nth control units CUNIT1~CUNITn includes a latch unit, a first inverter, and a selecting unit. Because structures of the first through nth control units CUNIT1~CUNITn are substantially similar, a structure and operation of only the first control unit CUNIT1 is described in an effort to avoid repetition.

A latch unit 910 receives a corresponding bit of the search data pattern SPAT and latches the bit. The latch unit 910 includes two inverters I2, I3. A first inverter I1 inverts an output of the latch unit 910. The selecting unit 920 outputs one of the output of the first inverter I1 and the output of the latch unit 910 as first search data SDATA1 in response to a corresponding control signal CTRL1. That is, the selecting unit 920 outputs the output of the latch unit 910 as the first search data SDATA1 if the corresponding control signal CTRL1 is at the first level and the output of the first inverter I1 as the first search data SDATA1 if the corresponding control signal CTRL1 is at the second level.

Because the first through nth control signals CTRL1~CTRLn are sequentially generated with the first level, the logic levels of from the first bit to the nth bit of an n-bit search data pattern SPAT are sequentially inverted. The search data pattern SPAT, whose logic level is sequentially inverted, is conducted to the corresponding CAM cells of the CAM cell array as the first through nth search data SDATA1~SDATAn.

Figure 10A:
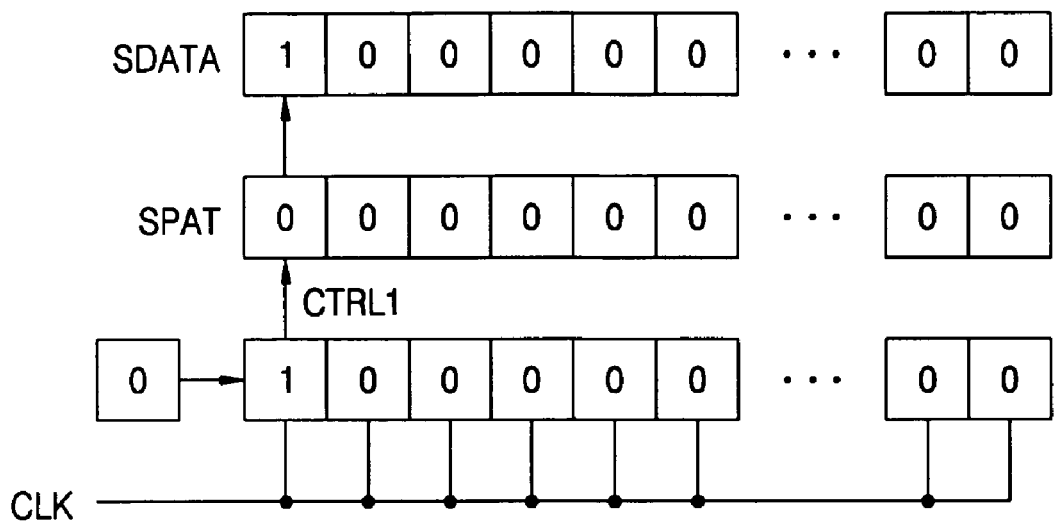
FIG. 10(a) is a drawing describing the generation of first search data when a first control signal is at a first level.
Figure 10B:
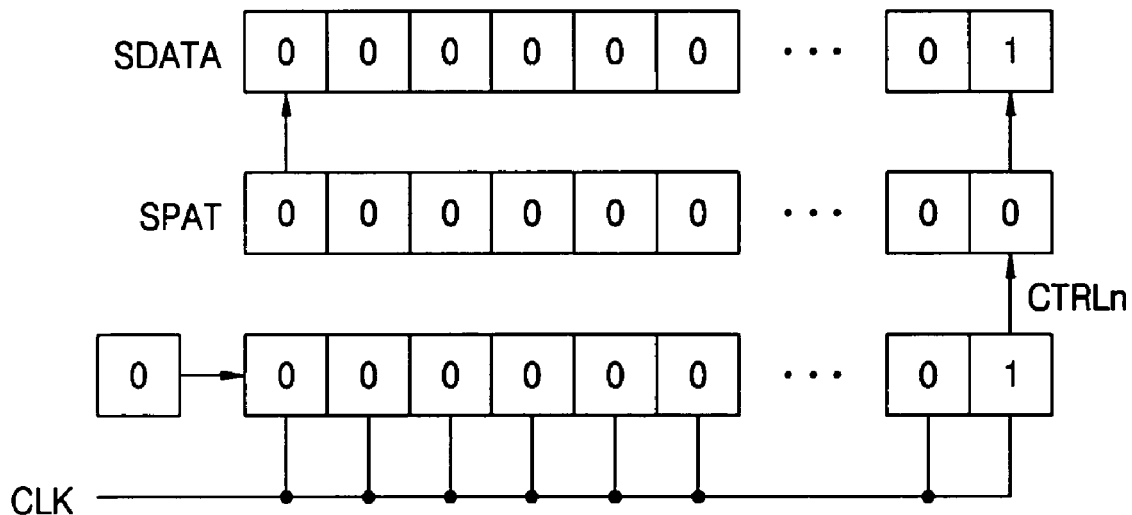
FIG. 10(b) is a drawing describing the generation of nth search data when an nth control signal is at the first level.

FIG. 10(a) is a drawing describing the generation of the first search data, for example, SDATA1, when the first control signal is at the first level. FIG. 10(b) is a drawing describing the generation of the nth search data, for example SDATAn, when the nth control signal is at the first level.

With reference to FIG. 10(a), after the high level value of the initial shift register SR0 is shifted to the first shift register SR1, the initial shift register SR0 stores the low level value and the first shift register SR1 stores the high level value. Therefore, the first shift register SR1 outputs the first control signal CTRL1 with the high level. Thereby, the logic level of the search data pattern SPAT is inverted in response to the first control signal CTRL1 and the first search data SDATA1 is generated with the high level. Likewise, the first through nth control signals CTRL1~CTRLn are sequentially generated with the high level.

With reference to FIG. 10(b), the nth shift register SRn stores the high level value. Therefore, the nth shift register SRn outputs the nth control signal CTRLn with the high level. Thereby, the logic level of the search data pattern SPAT is inverted in response to the nth control signal CTRLn and the nth search data SDATAn is generated with the high level.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A content addressable memory (CAM) comprising:
  a CAM cell array having first through nth CAM cells;
  a search data generating unit which receives an n-bit search data pattern and conducts first through nth search data to the first through nth CAM cells sharing a same word line and match line in response to first through nth control signals; and
  a shift register unit which generates the first through nth control signals whose logic levels are sequentially inverted in response to a clock signal wherein n is an integer.

2. The CAM of claim 1, wherein logic levels of the first through nth search data are inverted when corresponding first through nth control signals are generated with a first logic level.

3. The CAM of claim 1, wherein the shift register unit comprises:
   first through nth shift registers which are reset to a second logic level in response to a reset signal and sequentially generate the first through nth control signals with the first logic level in response to the clock signal; and
   an initial shift register which is reset to the first logic level in response to the reset signal and conducts an output signal to the first shift register in response to the clock signal.

4. The CAM of claim 1, wherein the search data generating unit comprises:
   first through nth control units which receive a corresponding bit of the n-bit search data pattern and output the search data in response to a corresponding control signal, and
   each of the first through nth control units comprises:
   a latch unit which receives the corresponding bit of the n-bit search data pattern and latches the bit;
   a first inverter which inverts an output signal of the latch unit; and
   a selecting unit which outputs one of an output signal of the first inverter and an output signal of the latch unit as the search data in response to the corresponding control signal.

5. The CAM of claim 4, wherein the selecting unit outputs the output signal of the latch unit as the search data when the corresponding control signal is at the first logic level.

6. A method of finding errors in a content addressable memory (CAM) cell array, comprising:
   generating first through nth control signals whose logic levels are sequentially inverted in response to a clock signal;
   receiving an n-bit search data pattern;
   in response to the first through nth control signals, outputting the n-bit search data pattern as the first through nth search data and a value, which is opposite a logic level of the search data pattern, as the first through nth search data; and
   finding errors in CAM cells of the CAM by conducting the first through nth search data to corresponding CAM cells wherein n is an integer.

7. The method of claim 6, wherein when outputting the first through nth search data, a value, which is opposite the logic level of the search data pattern, is output as the first through nth search data when the first through nth control signals are at a first logic level.

8. The method of claim 7, wherein the n-bit search data pattern is output as the first through nth search data when the first through nth control signals are at a second logic level.

* * * * *